United States Patent [19]
Yu

[11] Patent Number: 6,127,853
[45] Date of Patent: Oct. 3, 2000

[54] HIGH SPEED CURRENT-MODE SENSE-AMPLIFIER

[75] Inventor: Hung-Chang Yu, Taipei, Taiwan

[73] Assignee: Taiwan Semiconductor Manufacturing Co., Ltd., Hsinchu, Taiwan

[21] Appl. No.: 09/224,296

[22] Filed: Dec. 31, 1998

[51] Int. Cl.[7] ........................................................ G11C 7/06
[52] U.S. Cl. .................................................. 327/55; 327/57
[58] Field of Search .......................... 327/55, 57, 51–54, 327/56; 365/205, 207

[56] References Cited

U.S. PATENT DOCUMENTS

| | | | |
|---|---|---|---|
| 4,634,901 | 1/1987 | McElroy | 327/57 |
| 4,845,675 | 7/1989 | Krenik et al. | 327/57 |
| 5,563,533 | 10/1996 | Cave et al. | 327/55 |
| 5,903,171 | 5/1999 | Shieh | 327/55 |
| 5,963,495 | 10/1999 | Kumar | 365/207 |

*Primary Examiner*—Toan Tran
*Attorney, Agent, or Firm*—Harold L. Novick; Nath & Associates

[57] ABSTRACT

A current-direction sense-amplifier circuit for amplifying data signal read out from a bit-line of memory cells is disclosed. The current-direction sense-amplifier circuit includes two positive feedback loop circuits coupled each other. The first positive feedback loop circuit which having a data input terminal for receiving the data signal, first output node, and second output node for amplifying a differential voltage between a voltage of the first output node and a voltage of the second output node. The second positive feedback loop circuits being coupled with the first positive feedback loop circuit at the first output node and second output node of node so as to enlarge the loop voltage gain and make the increment and the decrement of voltage swing more symmetrical.

5 Claims, 7 Drawing Sheets

HIGH SPEED CURRENT-MODE SENSE-AMPLIFIER

BACKGROUND OF THE INVENTION

1. Field of the Invention

The present invention relates to a sense-amplifier circuitry for driving a solid-state memory device and more particularly, to a circuitry of high-speed current-mode sense-amplifier for using in multi-port SRAM memory device.

2. Description of the Prior Art

The trend in modem microelectronic devices and in the growing market requires low power, high-density devices to minimize device dimension in order to reduce unit cost per function and to improve device performance. In particular the semiconductor memory devices such as DRAM and SRAM are two types of major memories widely using for storing the video and audio data in personal computer. Since a high density and low power consumption of memory devices are demanded, hence, the requirement of virtual contact bit lines that generally be taken make one bit line loaded with several tens of memory cells. Therefore, current following through a addressed memory cell having data "1" or "0" varies of about tens of $\mu A$. Furthermore, a very low voltage may be as low as several tenths or hundreds mV is commonly sensed on data bus representing the addressed data. A suitable amplification is typically performed in a sense amplifier 200 to appropriately read the addressed data.

Figure 1:
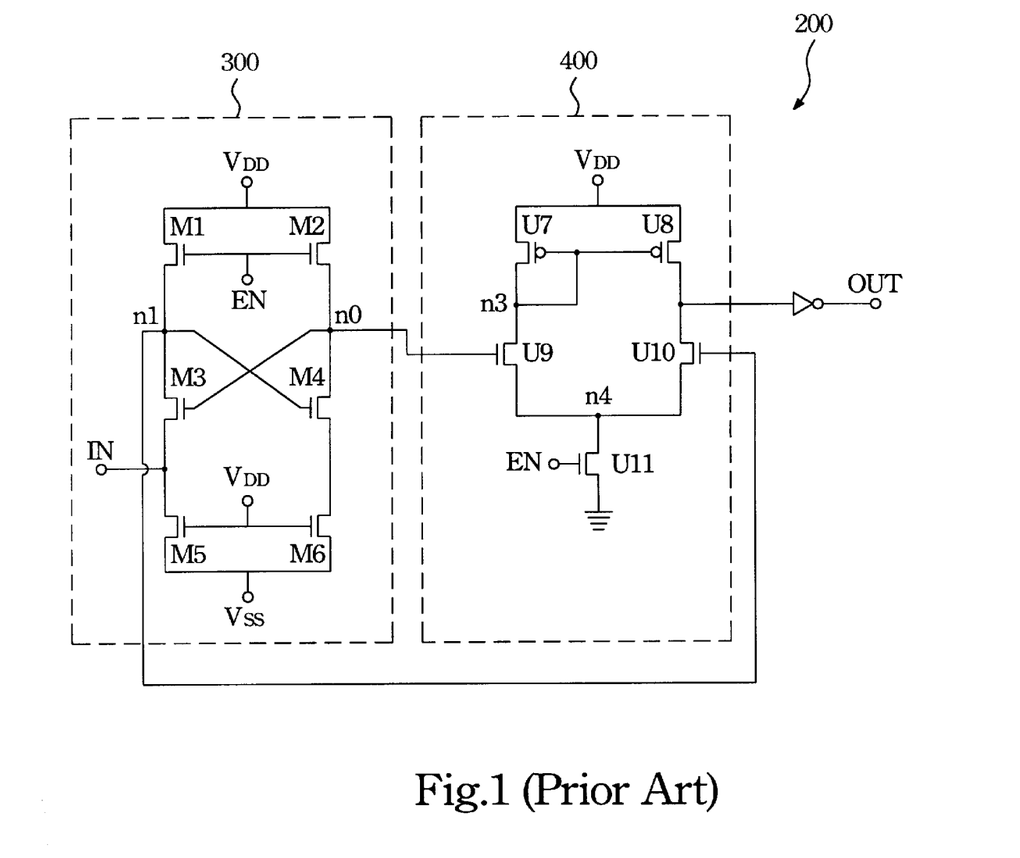
FIG. 1 is a sense amplifier using in the memory devices in accordance with the prior art.

As shown in FIG. 1 is a typical embodiment of sense-amplifier 200 circuitry in accordance with the prior art for using in multi-port RAM or DRAM. The sense-amplifier 200 comprises a current-direction sense-amplifier circuit 300, and a differential amplifier 400. The NMOS transistors M1, M2, M3, M4, M5 and M6 constitute the current-direction sense-amplifier circuit 300. The transistors M1 and M2 are with gates coupled each other for receiving an enable signal to turn on the circuit 300, and with drain terminals coupled for receiving a power $V_{DD}$ from a power supply. The source terminals of transistors M1 and M2 are connected with the output nodes n1 and n0, respectively. The transistor M3 and M4 are cross coupled by the gate terminals and the drain terminals, respectively, and the drain terminals of transistor M3 and M4 are coupled with the output nodes n0 and n1 respectively. Similar to the transistors M1 and M2, the transistor M5 and M6 are with gates coupled for receiving a voltage $V_{DD}$ and with source terminal coupled for receiving a voltage reference $V_{SS}$. The drain terminals of transistor M5 and M6 are connected with the source terminals of the transistors M3, and M4. In addition, the source of the transistor M3 is connected with an input data node IN for receiving a "data" from a node IN which couples with a single-end bit line.

The current-direction sense-amplifier circuit 300 is in response to a current flow in or flow out from the bit line 100 to generate two differential input potentials, no, and n1 of differential amplifier 400.

The differential amplifier circuit 400 includes two PMOS transistor U7 and U8 which form a current mirror circuit, two NMOS transistor U9 and U10 which receive the output voltages of the current-direction sense-amplifier circuit 300 no and n1, and an NMOS transistor U11 for receiving an enable signal. The differential amplifier 400 is powered by turn on the NMOS transistor U11 with the enable signal.

The operation of the current-direction sense-amplifier circuit 300 is based on the direction of current flow at node IN. When current flow into node IN, the source voltage of the transistor M3 goes up. This results in a decrease in Vgs (the voltage of gate to source) of the transistor M3 and in turn an increase in the source voltage of the transistor M1. Thus the voltage of node n1 (herein and after called $V_{n1}$) increases. At the same time, Vgs of the transistor M4 increases, which increases drain current of the transistor M4 and cause a decrease of source voltage of the transistor M2. Thus $V_{n0}$ decreases. Since node n0 connects to gate of transistor M3, thus as $V_{n0}$ decreases, the Vgs of transistor M3 further increases, and then n1 further goes up. Therefore a positive feedback loop is established. A differential voltage $\Delta V1$ between n1 and n0 appears.

Similarly, when current flows out from IN, the source voltage of transistor M3 goes down. This results in an increase in Vgs of transistor M3, and in turn a decrease in the source voltage of transistor M1. Thus $V_{n1}$ decreases. At the same time, the Vgs of the transistor M4 decreases, which causes a decrease of drain current of the transistor M4 and a increase of the source voltage of the transistor M2. Thus $V_{n0}$ increases with a result that Vgs of the transistor M3 further decreases. The voltage of n1 further goes down. Once again, a positive feedback loop is established and a differential voltage $\Delta V2$ between node n1 and n0 appears.

However, this positive feedback loop voltage gain is merely approximately close to unity. In addition, the voltage swing at n0 is smaller than that of at node n1. Therefore, when an increase voltage $\Delta V$ appears at node IN, an incremental differential voltage $\Delta V1 = V_{n1} - Vv_{n0}$. On the other hand, as a decrease $\Delta V$ appears at node IN, a decrement differential voltage $\Delta V2 = V_{n0} - V_{n1}$, is generated, however, $\Delta V2 < \Delta V1$. That is, an incremental gain and a decrement loop voltage gain are not uniform.

Figure 2:
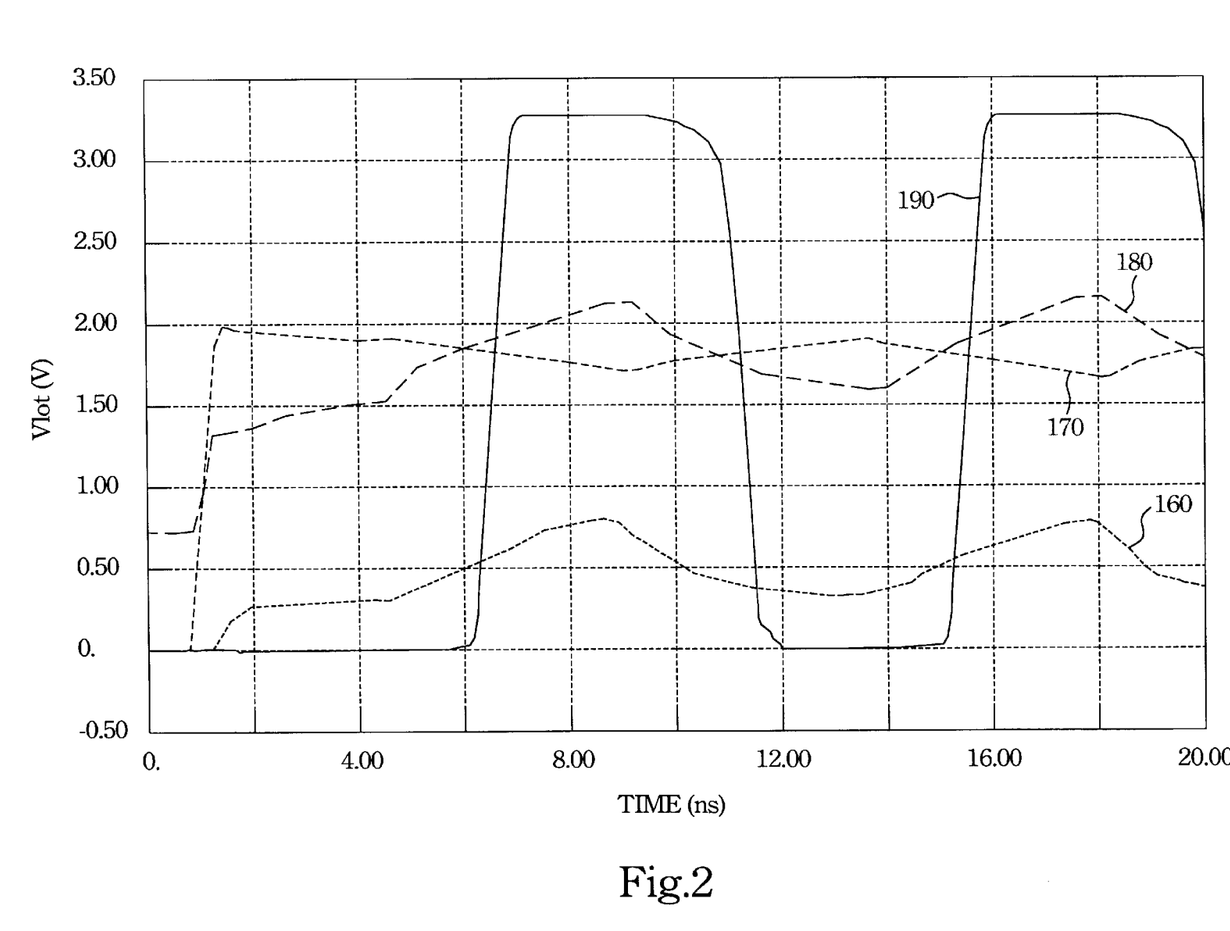
FIG. 2 is a simulation result according to the circuitry shown in the FIG. 1.
Figure 3:
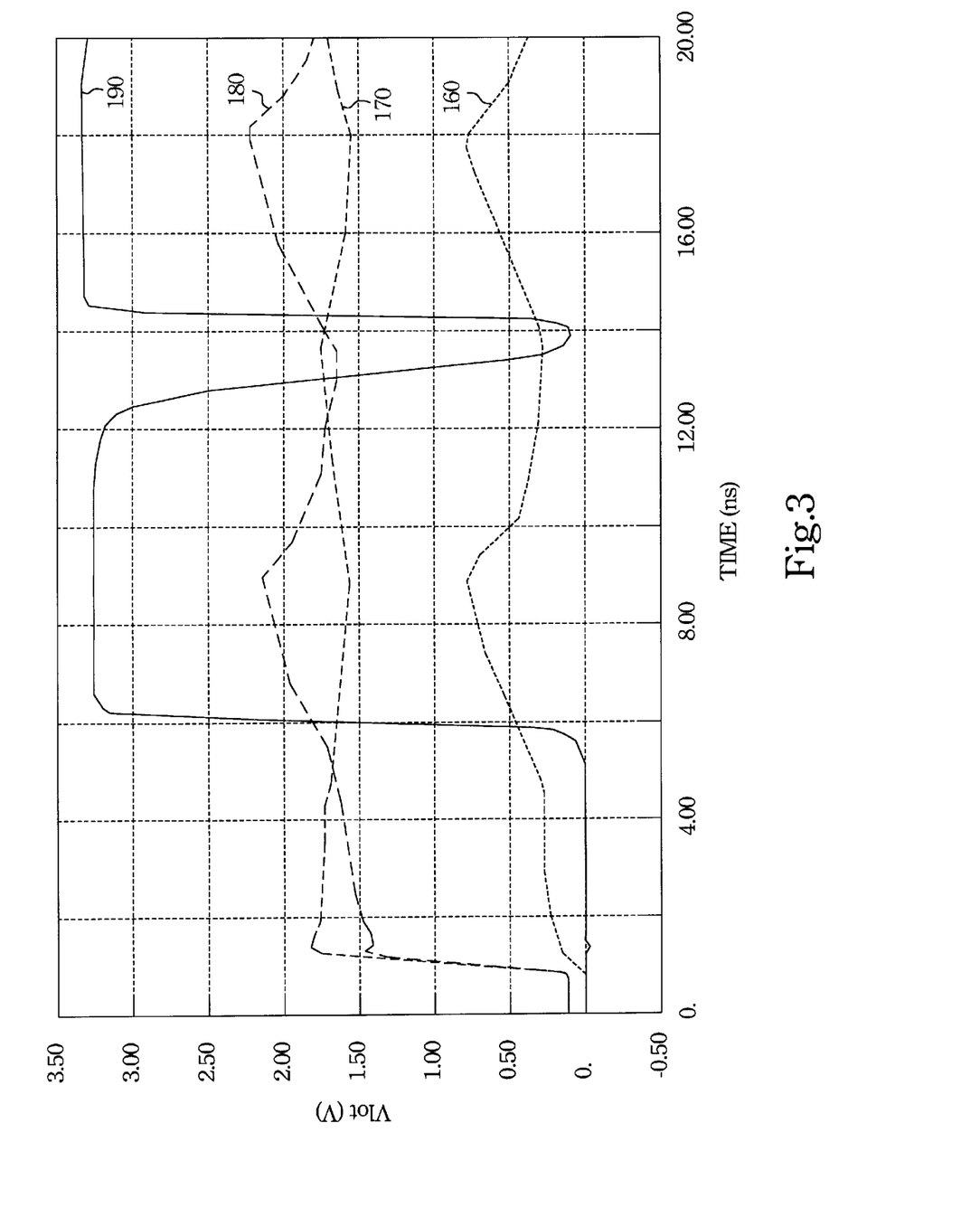
FIG. 3 is a simulation result according to the circuitry shown in the FIG. 1 but the sizes of the transistors are adjusted.
Figure 4:
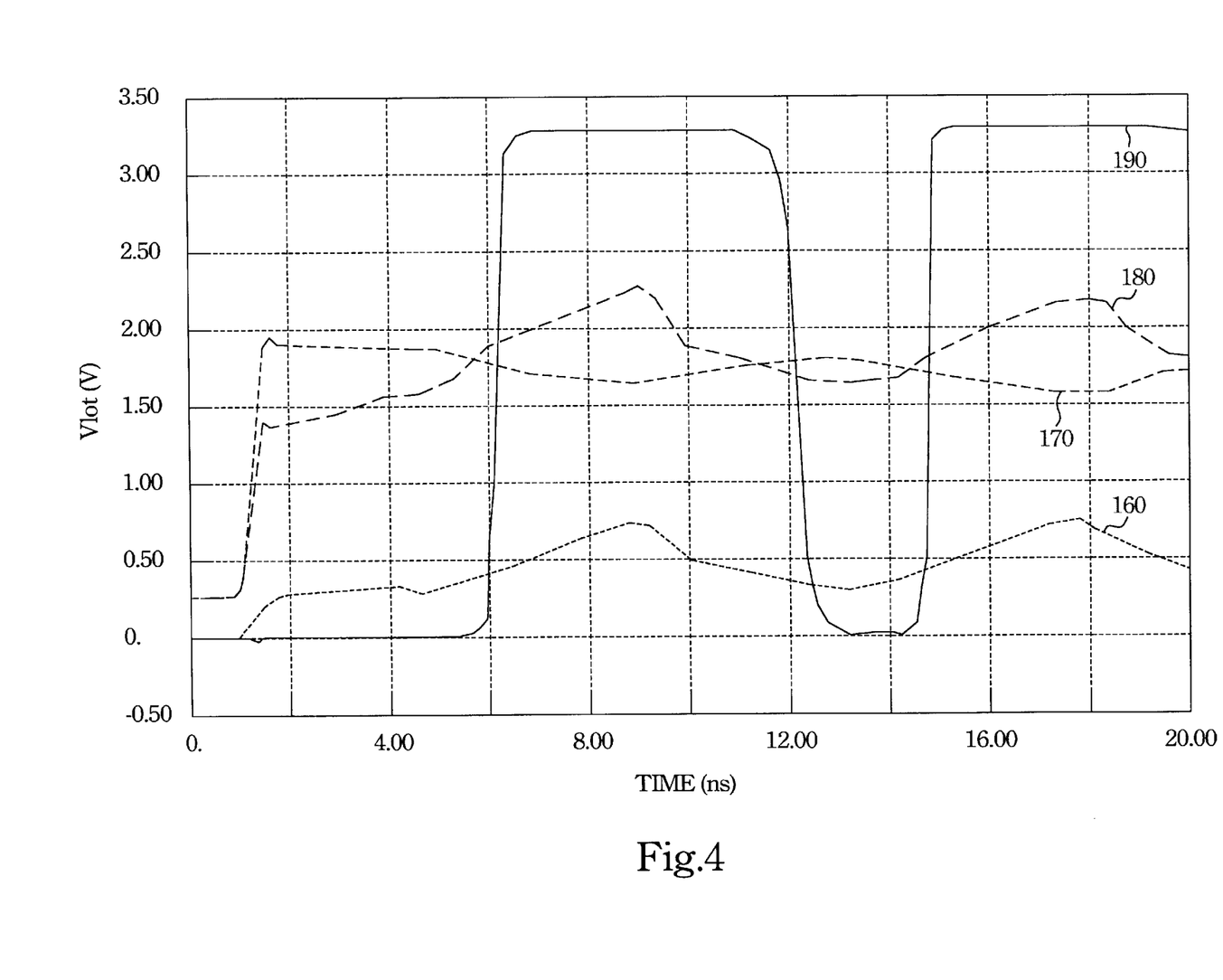
FIG. 4 is a simulation result according to the circuitry shown in the FIG. 1 but the sizes of the transistors are adjusted.
Figure 5:
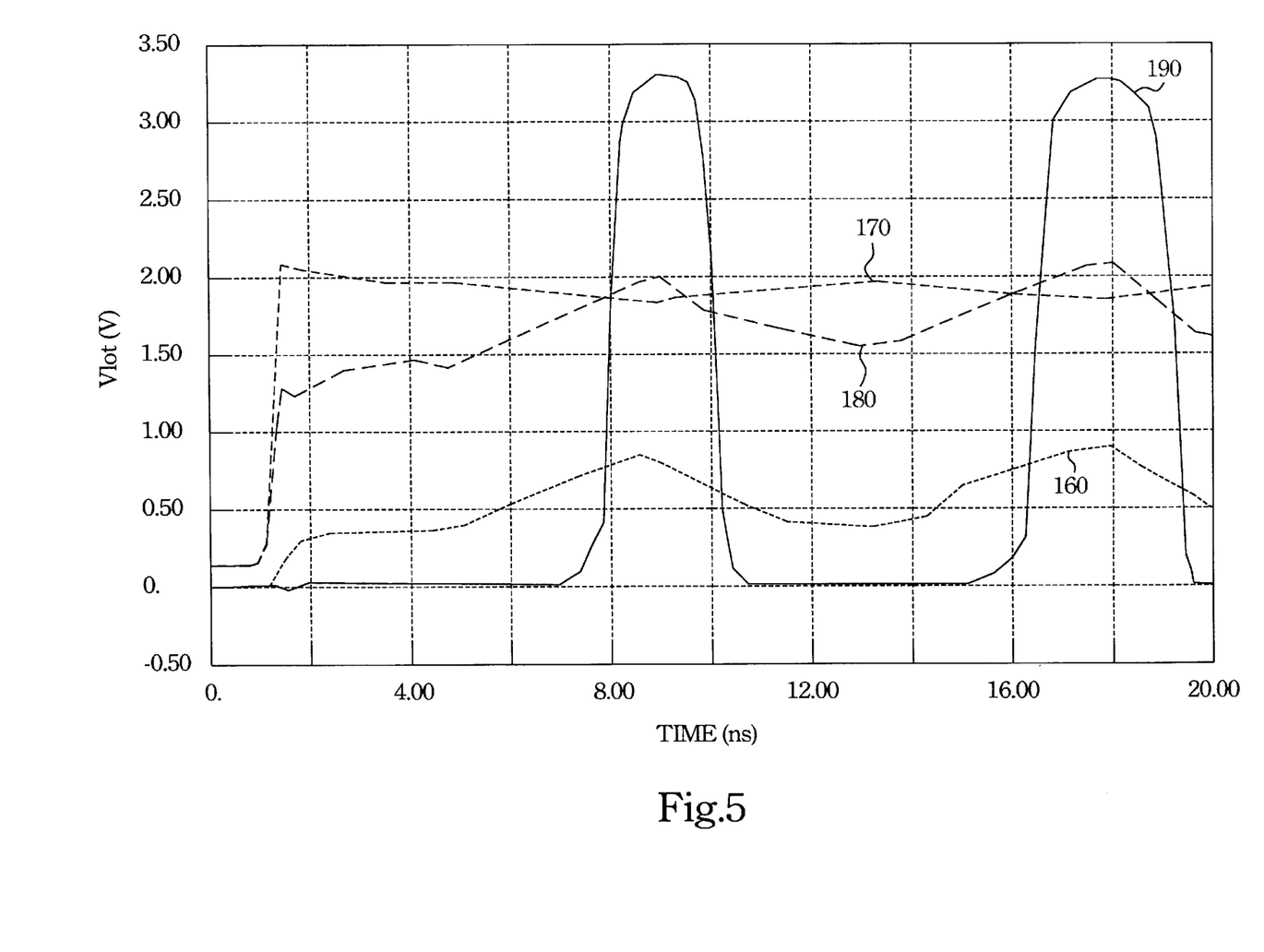
FIG. 5 is a simulation result according to the circuitry shown in the FIG. 1 but the sizes of the transistors are adjusted.

The simulation results are shown in FIGS. 2–5. In the Figs, the data signal 160 is received from the data input terminal IN, and then two signal 170, and 180 are output form the node n0 and n1, respectively. Then the signals 170, and 180 are input into the differential sense-amplifier 400 to obtain the digital data signal 190 from the OUT terminal. FIG. 2 shows typical variations of $\Delta V1$ and $\Delta V2$ with respect to the input data signal received from the node IN. The maximum of the differential voltages $\Delta V1_{max}$ and $\Delta V2_{max}$ are only about 0.35V and 0.25V, respectively. For achieve the goals of generating symmetrical differential gains, adjusting the channel widths of NMOS transistors in the current sense-amplifier circuit 300 are carried out. However, as shown in FIGS. 3 and 4, the voltage swing in node n0 is small. The larger of voltage swing in n1, results in larger differential voltage $\Delta V1$ and smaller differential voltage $\Delta V2$ is introduced. This output digital signal of sense-amplifier 200, especially while the DATA is "low", a spike-like wave form is formed. On the other hand, the decrement of differential voltage $\Delta V1$ gives the narrow width of digital data output "1", as shown in FIG. 5. All attempts by adjusting the sizes of transistor to increase the voltage swing of n0 are ineffectual. Small loop voltage gain (e.g. <0.2 V differential voltage) and asymmetrical loop voltage gain may cause circuit to risk process variation and noise interference. Thus there is an invention in need to increase loop voltage gain and to produce symmetrical loop voltage gain.

SUMMARY OF THE INVENTION

A current-direction sense-amplifier circuit for amplifying data signal read out from a bit-line of memory cells is disclosed. The current-direction sense-amplifier circuit includes two positive feedback loop circuits coupled each other. The first positive feedback loop circuit which having a data input terminal for receiving the data signal, first output node, and second output node to generate two amplified voltages at the first output node and at the second output node. The second positive feedback loop circuit comprises a first CMOS transistor and a second CMOS transistor. The first CMOS transistor and the second CMOS transistor are cross-coupled by gate input terminals, and output terminals, respectively. The second positive feedback loop circuits being coupled with the first positive feedback loop circuit at the first output node and second output node of node so as to enlarge the loop voltage gain and make the increment and the decrement of voltage swing more symmetrical.

BRIEF DESCRIPTION OF THE DRAWING

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

As forgoing depicted in the baground of the invention, the issues occur in the single positive feedback loop of the embodiment of the prior art are the facts that the voltage gain of the single positive feedback loop is merely approximately close to unity. In addition, the voltage swing at the two terminals is asymmetrical loop voltage gain, which may cause circuit to risk process variation and noise interference. Thus it exists space to increase loop voltage gain and to produce symmetrical loop voltage gain.

Figure 6:
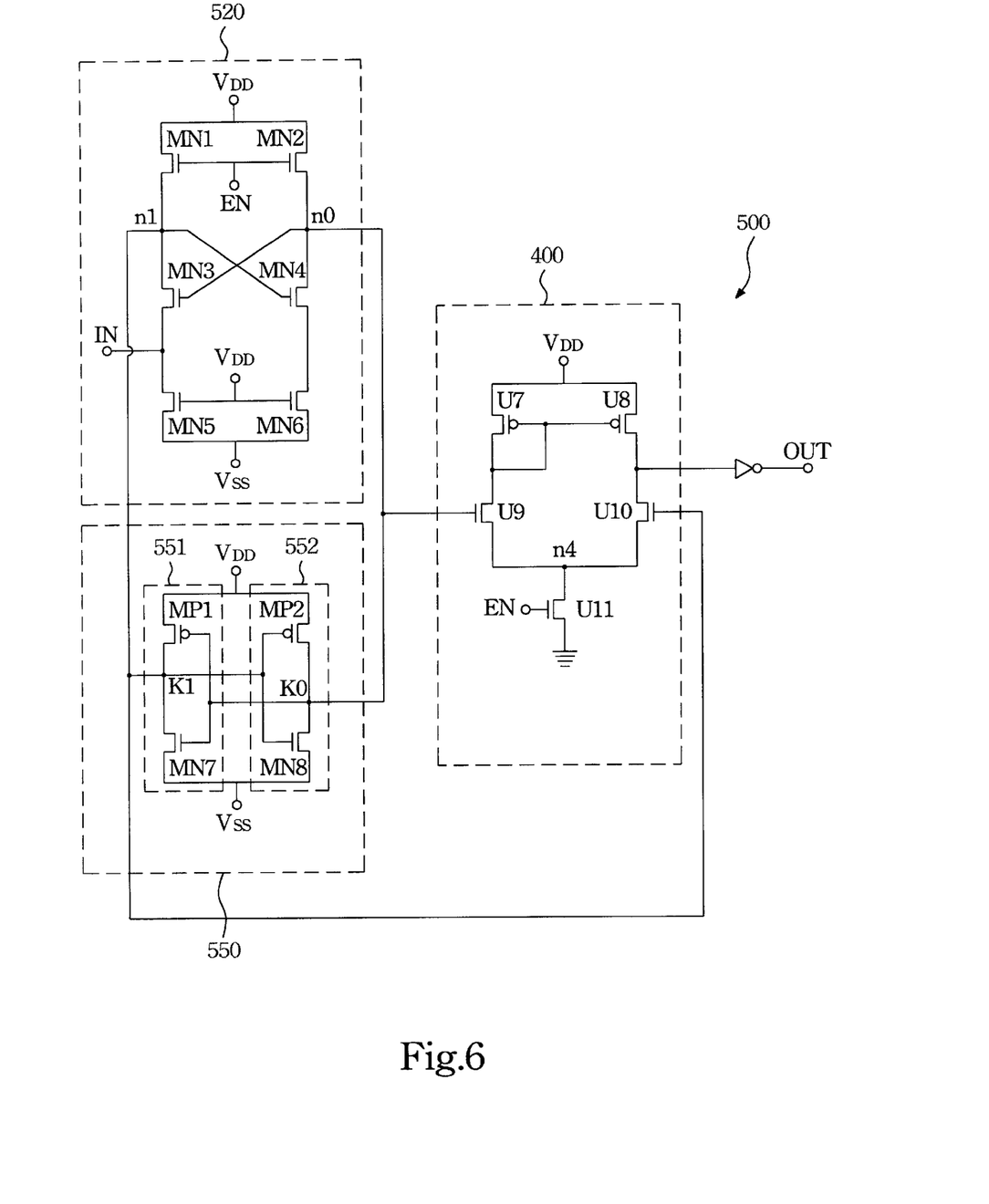
FIG. 6 is a sense amplifier using in the memory devices in accordance with the present invention.

The present invention constructs a memory sense amplifier circuitry that includes a differential amplifier circuit 400, and a modified current-direction sense-amplifier circuit 500. The modified current-direction sense-amplifier circuit 500 comprises a first positive feedback loop circuit 520 and a second positive feedback loop circuit 550, as shown in FIG. 6. In a preferred embodiment, the same as the positive feedback loop circuit 300 depicted in the prior art is utilized as the first-positive feedback loop circuit 520 of this invention. The first positive feedback loop circuit 520 having two output nodes n0 and n1 and an input node IN. The input terminal IN for receiving the data signal from a single-end bit line of memory devices (not shown). The second positive feedback loop circuit 550, in a preferred embodiment, comprises a first CMOS transistor 551 (transistors MP1 and MN7) and a second CMOS transistor.552 (transistors MP2 and MN8). The first CMOS transistor 551 and the second CMOS transistor 552 are cross-coupled by gate input terminals, and output terminals, respectively. The output terminals of the first and second CMOS transistors 551 and 552 represent by labels "k1" and "k0", and then are, respectively, coupled with output nodes n1 and n0. The source terminals of the PMOS transistors MP1 and MP2 are supplied by a voltage $V_{DD}$ and the source terminals of the NMOS transistors MN7 and MN8 are supplied by a voltage $V_{SS}$. The operation of the invention are illustrating as follows:

Similar to forgoing prior art depicted, as current flows into node IN, an increment of gate voltage of transistor MN8 increase Vgs of transistor MN8, which is helpful to making transistor MN8 pull down the voltage of node n0 together with MN4. At the same time, an increase of Vgs of transistor MP1 increases the source current of transistor MP1, which in turn increases the voltage node n1 further. Thus voltage swing of node n1 and n0 becomes larger.

Figure 7:
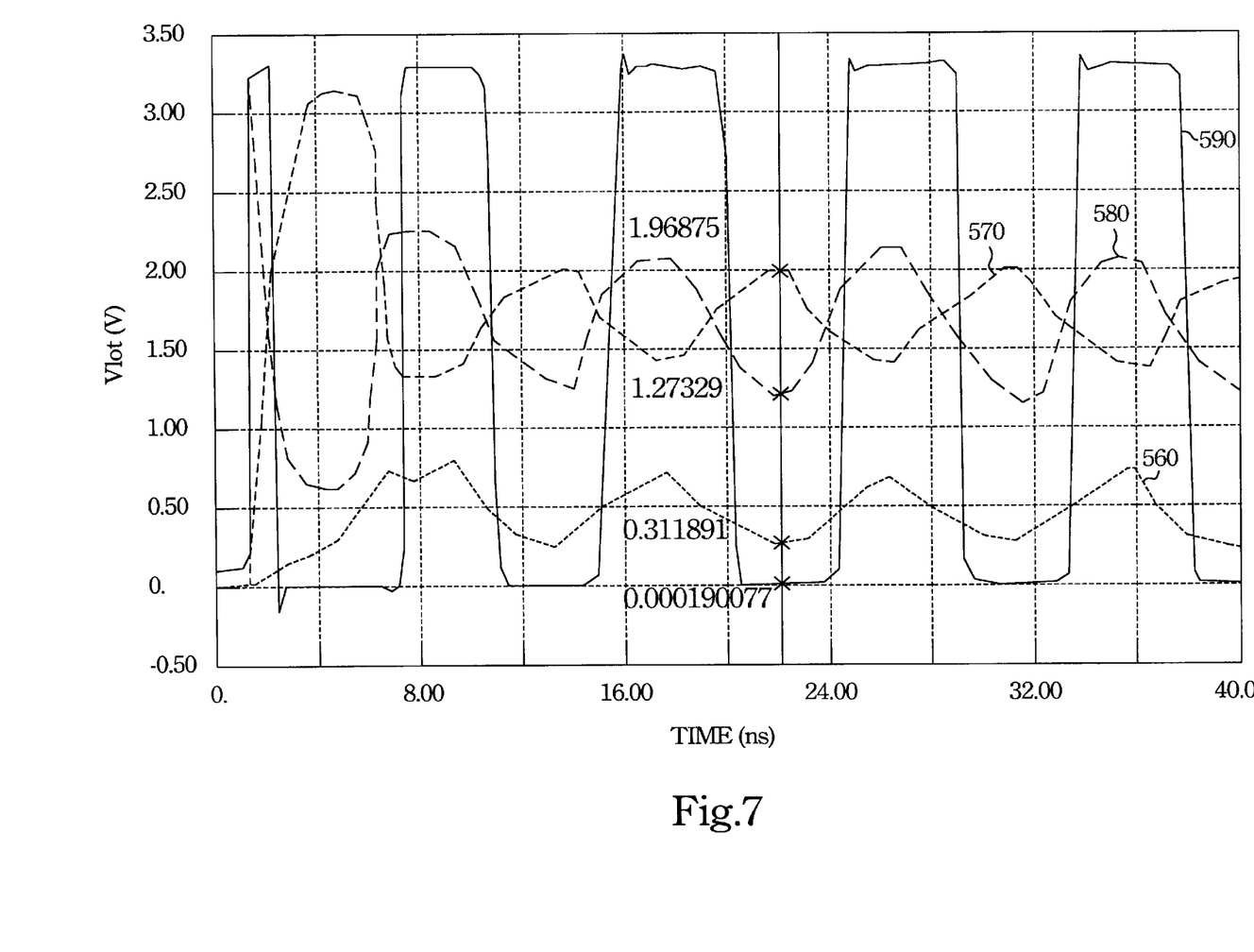
FIG. 7 is a simulation result according to the circuitry shown in the FIG. 6.

On the other hand, as current flows out from the data input terminal IN. there is a voltage drops ΔV at the data input terminal IN. The operation of transistor MN3 and MN4 is the same as transistor M3 and M4 in FIG. 1. The voltage drop ΔV at input terminal IN causes a voltage drop at the output node n1, which in turn increases Vgs of the transistor MP2 and reduces Vgs of transistor MN8. Thus an increase source current of MP2 causes a voltage at the output node n0 increase furthermore. That is, the transistor MP2 pulls up voltage of output node n0 together with transistor MN2. At the same time, an increment voltage at the output node n0 reduces Vgs of transistor MP1 but increases Vgs of the transistor MN7; Thus transistor MN7 helps transistor MN3 in pulling down the voltage at the output node n0. Once again a second positive feedback loop is established and voltage swing of output node n1 and n0 becomes larger. A larger loop voltage gain is achieved. A simulation result of the present invention is shown in FIG. 7. In the FIG. 7, the data signal 560 is using as data signal which is received from the data input terminal IN, and then two signal 570, and 580 are output form the node n0 (or k0) and n1 (or k1). Then the signals 570, and 580 are input into the differential sense-amplifier 400 to obtain the digital data signal 590 from the OUT terminal. The width of output data "1" or "0" are nearly the same The voltage gain at node n0 is intensified, the, differential voltage gain ΔV1 and ΔV2 are enhanced too (e.g. from a value of about 0.3 V in the prior art to of about 0.6 V in the invention).

Furthermore, the adjustment to the symmetrical loop voltage gain can be more flexibility achieved by properly adjusting device sizes of transistors MP1, MP2, MN7 and MN8.

The advantages of the invention are:

(1) Both the amplitude of decrement differential voltage and the increment differential voltage increase so that the issue by the process variations can be avoided.

(2) The symmetrical loop voltage gain can be easily obtained.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A current-direction sense-amplifier circuit for amplifying data signal read out from a bit-line of memory cells, said amplifier circuit comprising:

first positive feedback loop means having a data input terminal for receiving said data signal, first output node and second output node for generating a first output signal and a second output signal at said first output node and said second output node in response to said data signal, said first positive feedback loop means comprises:

a first power terminal for receiving a first potential from a power supply;

a second power terminal for receiving a second potential from said power supply, said second potential is lower than said first potential;

a first and a second transistors having gate terminals being connected to each other and having drain terminals being connected to each other, and having source terminals being coupled with said first and said second output nodes, respectively, said gate terminals receiving a signal to turn on said first and second transistors;

a third and a forth transistors having date terminals, source terminals and drain terminals, said third transistor being cross coupled with said forth transistor by said gate terminals and said drain terminals, said drain terminals of said third and second transistors being coupled with said source terminals of said first and said second transistors, respectively; and a fifth and a sixth transistors having gate terminals being connected to each other and connected with said first power terminal, having source terminals being connected and receiving said second power terminal, and having drain terminals being connected with said source terminals of said third and forth transistors, respectively, one of said drain terminals of said fifth and sixth transistors being connected with said data input terminal; and second positive feedback loop means being coupled to said first output node and second output node of said first positive feedback loop so that helps pull up a voltage difference of between said first output signal and said second output signal.

2. The amplifier circuit according to claim 1, wherein said data signal is the one of current flow in and out from said bit line.

3. The amplifier circuit according to claim 1, wherein said second positive feedback loop means comprises:

a first CMOS, having a gate input terminal, an output terminal, a first potential terminal, and a second potential terminal; and a second CMOS, having a gate input terminal, an output terminal, a first potential terminal, and a second potential terminal, said gate input terminal and said output terminal of said first CMOS being coupled with said output terminal and said gate input terminal of said second CMOS, respectively, said output terminals of said first and said second CMOS being coupled with said first and said second output nodes, respectively, said first potential terminals of said first CMOS and said second CMOS being coupled with a potential supply, said second potential terminals of said first CMOS and said second CMOS being coupled with a potential reference.

4. A current-direction sense-amplifier circuit for amplifying data signal read out from a bit-line of memory cells, said amplifier circuit comprising:

first positive feedback loop means having a data input terminal for receiving said data signal, first output node and second output node for generating a first output signal and a second output signal at said first output node and said second output node in response to said data signal, said first positive feedback loop means comprises;

a first power terminal for receiving a first potential from a power supply;

a second power terminal for receiving a second potential from said power supply, said second potential is lower than said first potential;

a first and a second transistors having gate terminals being connected to each other and having drain terminals being connected to each other, and having source terminals being coupled with said first and said second output nodes, respectively, said gate terminals receiving a signal to turn on said first and second transistors;

a third and a forth transistors having gate terminals, source terminals and drain terminals, said third transistor being cross coupled with said forth transistor by said gate terminals and said drain terminals, said drain terminals of said third and second transistors being coupled with said source terminals of said first and said second transistors, respectively; and a fifth and a sixth transistors having gate terminals being connected to each other and connected with said first power terminal, having source terminals being connected and receiving said second power terminal, and having drain terminals being connected with said source terminals of said third and forth transistors, respectively, one of said drain terminals of said fifth and sixth transistors being connected with said data input terminal; and second positive feedback loop means being coupled to said first output node and second output node of said first positive feedback loop so that helps pull up a voltage difference of between said first output signal and said second output signal, said second positive feedback loop means comprising:

a first CMOS, having a gate input terminal, an output terminal, a first potential terminal, and a second potential terminal; and a second CMOS, having a gate input terminal, an output terminal, a first potential terminal, and a second potential terminal, said gate input terminal and said output terminal of said first CMOS being coupled with said output terminal and said gate input terminal of said second CMOS, respectively, said output terminals of said first and said second CMOS being coupled with said first and said second output nodes, respectively, said first potential terminals of said first CMOS and said second CMOS being coupled with a potential supply, said second potential terminals of said first CMOS and said second CMOS being coupled with a potential reference.

5. The amplifier circuit according to claim 4, wherein said data signal is the one of current flow in and out from said bit line.

* * * * *